United States Patent [19]
Sachdev et al.

[11] Patent Number: 5,751,141
[45] Date of Patent: May 12, 1998

[54] $I_{DDQ}$-TESTING OF BIAS GENERATOR CIRCUIT

[75] Inventors: Manoj Sachdev; Botjo Atzema, both of Eindhoven, Netherlands

[73] Assignee: U.S. Philips Corporation, New York, N.Y.

[21] Appl. No.: 532,338

[22] Filed: Sep. 21, 1995

[30] Foreign Application Priority Data

Jul. 17, 1995 [EP] European Pat. Off. ............ 95201964

[51] Int. Cl.[6] .......................... G05F 3/04; H01H 31/02
[52] U.S. Cl. .......................... 323/312; 324/537; 371/22.5
[58] Field of Search .......................... 323/311, 312, 323/315; 324/158.1, 120, 537; 371/22.1, 22.5, 22.6

[56] References Cited

U.S. PATENT DOCUMENTS

| | | | |
|---|---|---|---|
| 5,057,774 | 10/1991 | Verhelst et al. | 371/22.5 |
| 5,371,457 | 12/1994 | Lipp | 324/158.1 |
| 5,394,026 | 2/1995 | Yu et al. | 327/536 |
| 5,459,737 | 10/1995 | Andrews | 371/22.5 |
| 5,485,095 | 1/1996 | Bertsch et al. | 324/537 |
| 5,497,073 | 3/1996 | Bohme et al. | 323/312 |

Primary Examiner—Stuart N. Hecker
Attorney, Agent, or Firm—Steven R. Biren

[57] ABSTRACT

A bias generator is tested in an $I_{DDQ}$-scheme by applying each respective one of the bias voltages to a respective PFET that is individually gated by a respective NFET. This permits measuring the quiescent currents. Any deviation in the bias voltages is translated into a deviation of the quiescent current.

6 Claims, 2 Drawing Sheets

$I_{DDQ}$-TESTING OF BIAS GENERATOR CIRCUIT

FIELD OF THE INVENTION

The invention relates to an electronic circuit comprising first and second supply nodes for connection to first and second supply voltages, and comprising a bias generator for providing at least one stable bias signal.

BACKGROUND OF THE INVENTION

A bias generator is an integral and well known building block for electronic circuitry. As apparent from its name, a bias generator provides one or more stable, time-invariant signals for circuits like amplifiers, comparators and oscillators. A typical example of such an electronic circuit is a parallel (flash) A/D converter. In a parallel A/D converter an analog input signal is applied to a plurality of comparators. Each comparator also receives an input reference voltage that is different from the one received by another comparator. The bias generator maintains the operating points of these comparators to ensure an optimal performance (i.e., gain, resolving time, operational frequency, metastability, dynamic range etc.).

OBJECT OF THE INVENTION

Conventional tests conducted on circuits (e.g., the flash A/D converter) are unable to detect various malfunctions, such as manufacturing process defects and parametric process variations, in the bias generators. Detection of these malfunctions requires unconventional, tedious, long test procedures. It is therefore, inter alia, an object of the invention to provide a design-for-testability measure for the bias generator.

SUMMARY OF THE INVENTION

To this end, the invention provides an electronic circuit as specified in the preamble, characterized in that the circuit further comprises a current path between the first and second supply nodes for enabling creating a quiescent current under control of the bias signal.

The bias signal of a defect-free bias generator gives rise to a quiescent current in current path whose magnitude is known in advance, e.g., through computations. The current path enables measuring the actual magnitude of the quiescent current. If the presence of a defect in the bias generator influences the bias signal, this defect is represented by a quiescent current whose magnitude deviates from the theoretical magnitude. As known, testing through quiescent current measurement, also referred to as $I_{DDQ}$-testing, is becoming an increasingly more important test tool. The testing of the bias generator according to the invention fits in nicely with $I_{DDQ}$ strategies.

The invention is in particular, but not exclusively, relevant to A/D converters.

BRIEF DESCRIPTION OF THE DRAWING

The invention is explained below in further detail and by way of example with reference to the accompanying drawing, wherein.

Throughout the drawing like reference symbols indicate similar or corresponding features.

DESCRIPTION OF THE PREFERRED EMBODIMENTS

Figure 1:
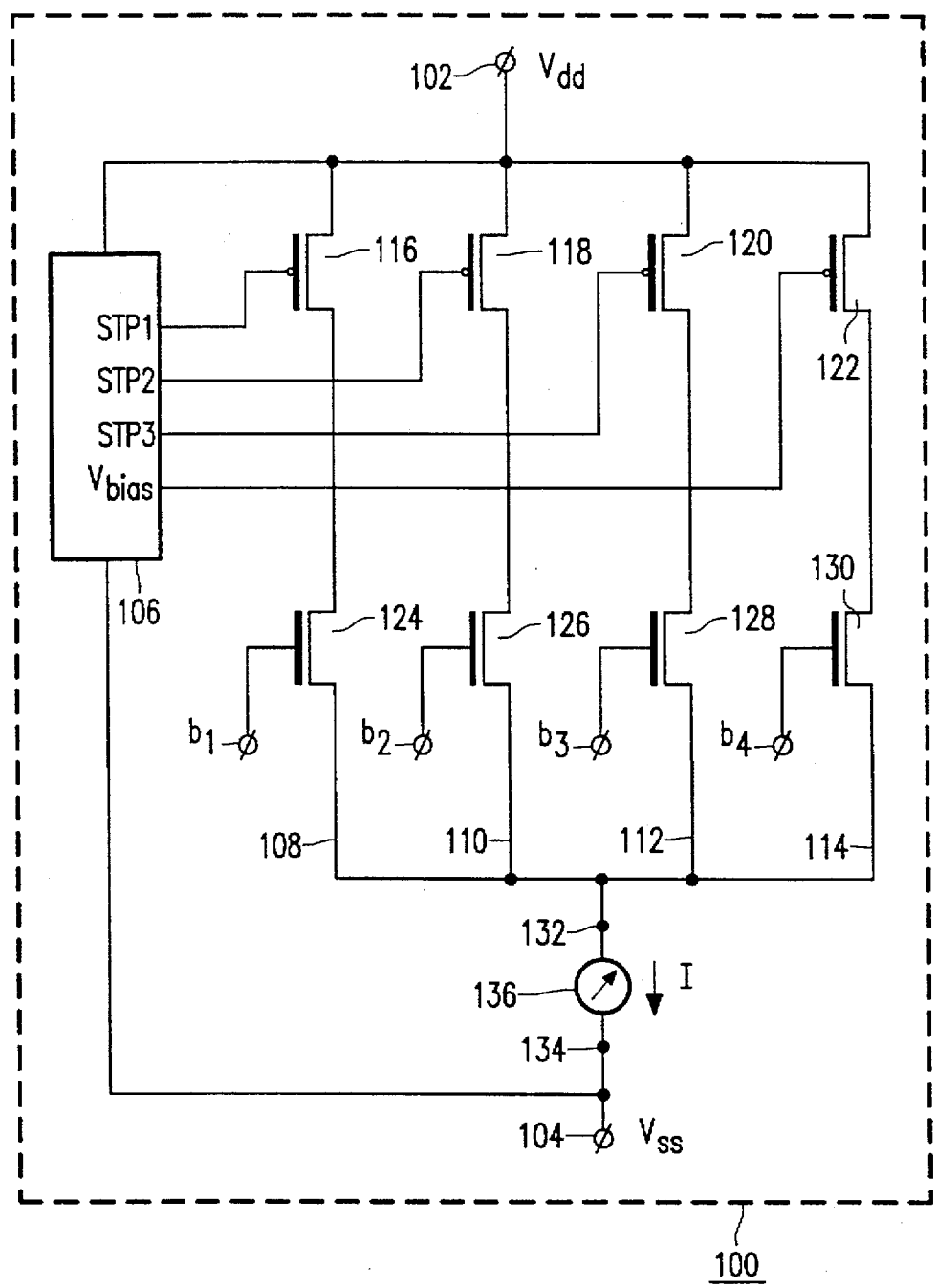
FIG. 1 is a diagram of a first electronic circuit with a bias generator and a plurality of current paths.

FIG. 1 is a diagram of an electronic circuit 100 that includes, e.g., an A/D converter (not shown). The circuit comprises a first supply node 102 for connection to a first supply voltage ($V_{dd}$), a second supply node 104 for connection to a second supply voltage ($V_{ss}$), a bias generator 106 and a plurality of current paths 108, 110, 112 and 114. Bias generator 106 is operative to provide four bias signals, namely, stp1 (3.2 Volts), stp2 (3.2 Volts), stp3 (3.4 Volts) and $V_{bias}$ (2.3 Volts), wherein the values between parentheses indicate ideal values. In this example, stp1 and stp2 have the same value, e.g. because they are generated separately so as not to overload generator 106. Each respective one of current paths 108–114 comprises a series arrangement of a respective one of PFETs 116, 118, 120 and 122, and a respective one of NFETs 124, 126, 128 and 130. Each respective one of the bias signals controls a respective one of PFETs 116–122. In this way, each of PFETs 116–122 functions as a voltage-to-current converter or a voltage controlled current source. Each respective one of NFETs 124–130 receives a respective one of enable signals b1, b2, b3 and b4. Each of NFETs 124–130 functions as a switch. This scheme permits measurement of a quiescent current I through each path individually and through multiple paths. To this end, for example, bonding pads 132 and 134 are provided that are normally disconnected in operational use of circuit 100. During testing, a current measuring device 136 is connected between pads 132 and 134 to perform the quiescent current test.

As is clear, a complementary embodiment is feasible wherein NFETs are used as voltage-to-current converters and PFETs as switches. A hybrid embodiment is possible as well, wherein some of the voltage-to-current converters are PFETs and others are NFETs, and wherein some of the switches are PFETs and others NFETs. Alternatively, transistors of the same conductivity type can be used as both switch and voltage-to-current converter. Whichever configuration is chosen depends on, e.g., the magnitude of the individual bias signals.

Figure 2:
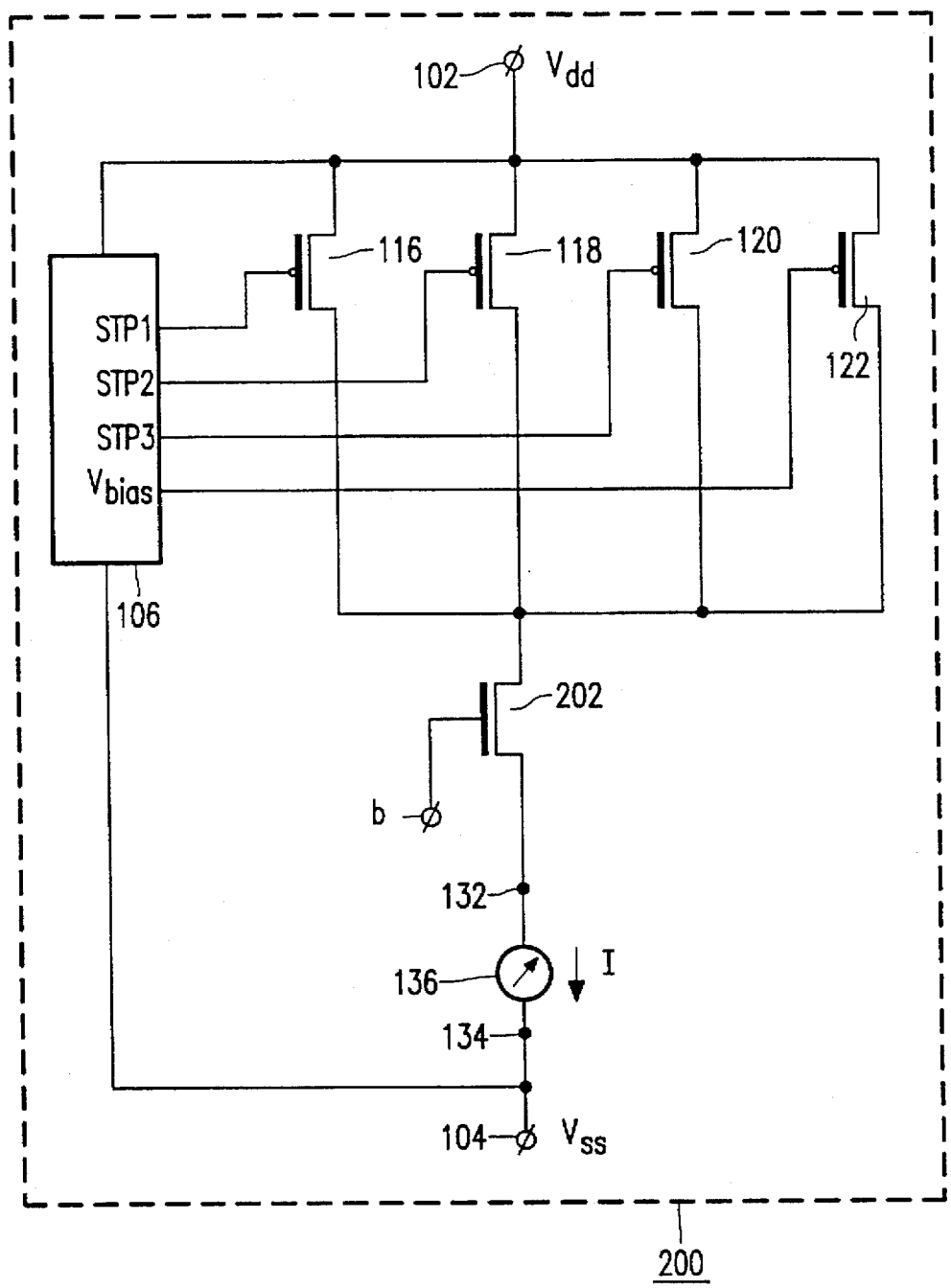
FIG. 2 is a diagram of a second electronic circuit with a bias generator and current paths.

FIG. 2 is a diagram of an electronic circuit 200 largely similar to circuit 100, but now with a single switch 202 in series with a parallel arrangement of voltage-to-current converters 116–122. An enable signal "b" controls switch 202. This configuration enables measuring the aggregate current I through the parallel arrangement.

We claim:

1. An electronic circuit comprising a first supply node for connection to a first voltage and a second supply node for connection to a second supply voltage, bias generating means for generating at least a first stable bias signal, and a first current path between the first and second supply nodes including a first voltage-to-current converter for converting the first stable bias signal into a first quiescent current under control of the first stable bias signal, and a first switch controllable by a first control signal for enabling or disabling the first path, wherein the first voltage-to-current converter comprises a first transistor and the first switch comprises a second transistor, the first and second transistors having their main conduction channels connected in series.

2. An electronic circuit as claimed in claim 1, further comprising test means arranged in series with said first current path for, by measuring said first quiescent current, implicitly testing said first stable bias signal.

3. A circuit as claimed in claim 1, wherein said bias generating means further generates a second stable bias signal, said circuit comprises a second current path between the first and second supply nodes, including a second voltage-to-current converter for converting the second stable bias signal into a second quiescent current under control of the second stable bias signal, and a second switch controllable by a second control signal for enabling or disabling the second path, wherein the second voltage-to-current converter comprises a third transistor and the second switch comprises a fourth transistor, the third and fourth transistors having their main conduction channels connected in series, the circuit further comprising measuring means coupled in series with said first and second current paths and arranged for separately measuring said first and second quiescent currents therein.

4. An electronic circuit as claimed in claim 3, furthermore comprising test means arranged in series with said measuring means for, by measuring said first and second quiescent currents, implicitly testing said first and second stable bias signals, respectively.

5. A circuit as claimed in claim 1, wherein said bias generating means further generates a second stable bias signal, said circuit comprises a second current path between the first and second supply nodes, including a second voltage-to-current converter for converting the second stable bias signal into a second quiescent current under control of the second stable bias signal, and a second switch controllable by a second control signal for enabling or disabling the second path, wherein the first and second switches are combined, wherein the second voltage-to-current converter comprises a third transistor, the second and third transistors having their main conduction channels connected in series, the circuit further comprising measuring means connected in series with said first and second current paths for jointly measuring said first and second quiescent currents therein.

6. An electronic circuit as claimed in claim 5, further comprising test means arranged in series with said measuring means for, by jointly measuring said first and second quiescent currents, implicitly testing said first and second stable bias signals, respectively.

* * * * *